(12) United States Patent
Massler et al.

(10) Patent No.: US 7,318,847 B2
(45) Date of Patent: Jan. 15, 2008

(54) STRUCTURED COATING SYSTEM

(75) Inventors: Orlaw Massler, Eschen (DE); Christian Wohlrab, Feldkirch (AT)

(73) Assignee: Oerlikon Trading AG, Trubbach, Trubbach (CH)

( * ) Notice: Subject to any disclaimer, the term of this patent is extended or adjusted under 35 U.S.C. 154(b) by 9 days.

(21) Appl. No.: 10/511,981

(22) PCT Filed: Apr. 22, 2003

(86) PCT No.: PCT/CH03/00262

§ 371 (c)(1),
(2), (4) Date: Oct. 20, 2004

(87) PCT Pub. No.: WO03/091474

PCT Pub. Date: Nov. 6, 2003

(65) Prior Publication Data

US 2005/0175837 A1   Aug. 11, 2005

(30) Foreign Application Priority Data

Apr. 25, 2002 (CH) ................................. 0702/02

(51) Int. Cl.
*C23C 14/58* (2006.01)
*F16C 33/10* (2006.01)

(52) U.S. Cl. .............. 51/307; 51/309; 384/125; 384/907; 427/249.1; 427/249.7; 427/249.9; 427/249.15; 427/419.1; 427/419.7; 428/156; 428/141; 428/336; 428/408; 428/698

(58) Field of Classification Search .............. 428/156, 428/141, 408, 698, 704, 336; 384/125, 907; 51/307, 309; 427/249.1, 249.7, 249.9, 249.15, 427/271, 331, 419.1, 419.7
See application file for complete search history.

(56) References Cited

U.S. PATENT DOCUMENTS

| | | | | |
|---|---|---|---|---|
| 4,636,285 A | * | 1/1987 | Tarumoto et al. | 204/192.31 |
| 4,661,064 A | * | 4/1987 | Beltramini | 451/547 |
| 5,834,094 A | * | 11/1998 | Etsion et al. | 428/156 |
| 6,740,393 B1 | * | 5/2004 | Massler et al. | 428/408 |

FOREIGN PATENT DOCUMENTS

| | | | |
|---|---|---|---|
| DE | 3634708 | * | 4/1988 |
| EP | 527 450 | * | 2/1993 |
| JP | 01-152298 | * | 6/1989 |
| JP | 05-156425 | * | 6/1993 |
| JP | 2000-178720 | * | 6/2000 |

OTHER PUBLICATIONS

Intl. Preliminary Exam. Report for PCT/CH2003/000262.

* cited by examiner

*Primary Examiner*—Archene Turner
(74) *Attorney, Agent, or Firm*—Notaro & Michalos PC

(57) ABSTRACT

Workpiece with at least one functional face and a layer system deposited on at least a portion of the functional face as well as a structure pattern, which encompasses at least a portion of the layer system and which is comprised of at least one three dimensional micro structure (5) with structure depth S, characterized in that the deposited layer system is deposited with PVD, CVD or combined PCD/CVD processes, and the three dimensional micro structure (5) extends from the surface of the layer system (4) up into the workpiece, such that the latter is uncoated in a lower region of the micro structure (5).

Figure 1:
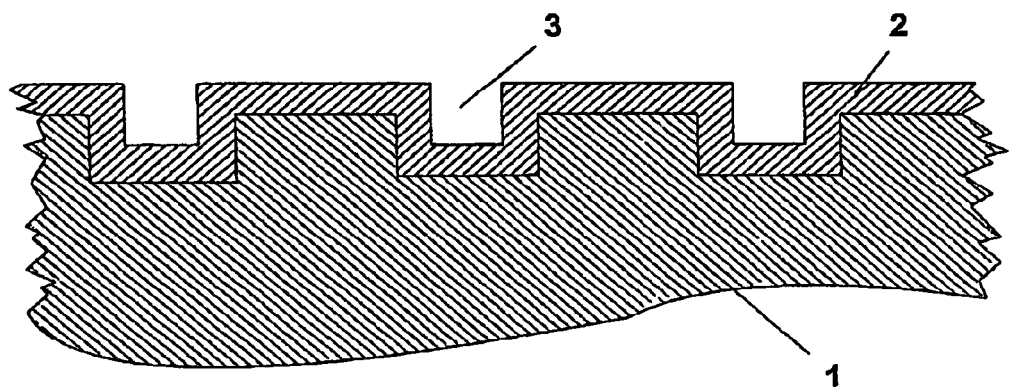

35 Claims, 3 Drawing Sheets

STRUCTURED COATING SYSTEM

The invention relates to a workpiece coated with a layer system, as well as a method for the production of such a workpiece. Preferred embodiments of the invention are disclosed as well.

For some time the application has been known of different structures onto structural parts and components subject to slide stress utilized in the field of mechanical engineering, such as for example in motor and pump techniques or as a dynamic sealing element in the conveyance of fluids. With this application a maximally uniform distribution of a lubricant or fluid is to be attained in order to avoid deficiency of lubrication and the hazard entailed therein of damaging or even the seizing of structural parts moved against one another.

For example U.S. Pat. No. 4,573,690 discloses a body moved against a sealing ring with defined cavities on the surface, as well as a mechanical method for producing the cavities. When the latter are used they effect pressure fluctuations of a lubricant introduced between sealing ring and body, whereby the tearing-off of the lubricant film, and therewith the direct contact of solid surfaces, is to be avoided.

Other methods for the production of structured surfaces are also known. U.S. Pat. No. 5,473,138 describes a method for increasing metallic and ceramic surface areas by means of laser exposure. WO 98/14710 describes a method for the production of a friction bearing, an optimized pore distribution being generated for example by means of a pulse laser on a slide face of a bearing.

The disadvantage in the case of the above cited structural parts is that in the case of potentially occurring states of deficiencies of lubrication, there is always still contact possible of two materials which, with respect to their surface properties, are similar or even identical. Under such conditions cold welding or seizing of a, for example, metallic material pairing (for example sealing ring/counterbody) cannot always be avoided with certainty. This applies especially also to complex machines with tribologically stressed parts, on which, due to high relative speeds and/or surface pressure, states of deficiencies of lubrication, and correspondingly increased wear, can occur. Examples of this from the field of engine building are valve trains in modern internal combustion engines laid out for high performances, in which primarily bucket tappets and piston rings are to some extent exposed to extremely high loading.

Tools with a textured surface structure are also known from U. Popp et al. "Excimer Laser Texturing of Tool Surfaces and its Influence on Friction in Cold Forging", Proc. of the 2nd Int. Conf. "The Coatings in Manufacturing Engineering 2001". After applying an approximately 2 μm thick TiN layer, approximately 1 μm deep structures were produced on the functional face of extrusion tools by means of excimer lasers. In subsequent tests an improvement of the wear properties was found.

The present invention addresses the problem of further increasing the performance capacity and reliability of PVD- and/or CVD-coated workpieces, in particular of structural parts or tools, which are subject to strong tribologic stress, in particular sliding stress as well as providing a method for the production of such workpieces.

In this connection, it was unexpectedly found to be a significant advantage to introduce microstructures into a layer system, applied at least partially on the functional face(s) of a workpiece, such that the vertical extent of the (three-dimensional) microstructure extends from the surface of the layer system through the layer up into the workpiece such that this workpiece is uncoated in a lower region of the structure.

For reasons of reproducibility and productivity it was found to be favorable to set the ratio d/s of the layer thickness d to the structure depth s to between 0.05 and 0.9, preferably between 0.1 and 0.6. The degree of areal coverage, significant for the setting of the retention capacity of lubricants as well as for the structure depth and geometry, i.e. the ratio of the surface of the microstructure to the total surface provided with a structure pattern, was set between 10 and 50%; but the best results were attained with a degree of areal coverage of 15-35%.

For small structures or structure cross sections, i.e. structures with the largest lateral dimension between 5 and 350 μm, the cross section of the cavities was selected to be circular, however preferably conical. It was found to be advantageous in many structures to set the tangential angle, i.e. the angle between the surface horizontal and an imaginary straight line in contact on the decreasing structure slope, as flat as possible, i.e. to less than 20°, however preferably to less than 10° or 5°.

The structures were produced with a laser beam, and, for the sake of simplicity, primarily circular structures were formed. But as a person skilled in the art knows, differently shaped structures, for example, circular, elliptical, line-form, triangular, rectangular, polygonal or also more complex structures can be utilized to advantage in individual application cases.

It is furthermore also known to produce similar structures through mechanical methods, such as, for example, by means of stamping, grinding, honing, further by means of micromechanical methods, but also through etching processes, which are especially suitable for the production of complex structures. In the latter, plasma etching processes or chemical, for example electrochemical, etching processes can be employed. As an example will be listed here the photoresist process, in which, after a photosensitive lacquer has been applied, it is exposed with an, if required inverse, structure pattern. The two-dimensional structure pattern produced in this manner can be etched into the surface in a subsequent method step. A further feasibility is the selective application of an etch-resistant lacquer layer by means of diverse laminating techniques.

To test the suitability for use with structured surfaces, four different slide layer systems were tested, namely an a-C:H, or DLC, i.e. an amorphous or diamond-like carbon layer, such as is known for example from WO 0179585A1, a MeC/C, i.e. a metal or metal carbide/carbon layer also containing a fraction of hydrogen, a hard layer of TiAlN as well as a hard layer-supported WC/C layer.

In a tribological ball-and-disk test an increase of the service life of the coated disks was obtained with all layer types. With the DLC, as well as also with the WC/carbon layers, the wear of the uncoated ball was simultaneously also decreased. This property is especially significant for tribologically stressed structural parts, in which the wear of the entire system must be kept to a minimum. As a function of the structure depth or of the time of structuring, i.e. before or after the coating, the wear behaviour of the uncoated as well as also of the coated test body showed different levels of improvement through the additional structuring.

Unexpectedly, structure patterns which had microstructures applied only after the coating and which, in their vertical extent, reached up to the base material of the workpiece, were found to be superior to other structures which were applied before the coating or those that were applied after the coating but with a vertical extent less than the layer thickness. It is here of significance that the microstructures are uncoated in their lower region. It is therefore advantageous to generate the structure pattern after the coating, since otherwise, at least in the case of relatively flat structures, coating of the entire structure contour occurs. Although the precise reason for this behavior is not known in detail, one reason could be the different wettability of the layer and the material of the base material with respect to different lubrication fluids. The above DLC layers show, for example, better wettability with mineral oil than do steels.

The test results further showed unexpectedly that workpieces coated with DLC as well as with Me/C, MeC/C or WC/C slide layer systems make possible even with conventionally produced structures a marked improvement of the tribological properties in comparison to structured hard layers such as for example TiAlN or known structured TiN layers.

Although the investigations have so far been substantially limited to the above cited layer systems, it is nevertheless readily comprehensible to a person skilled in the art in the field of slide or hard material coating that for a workpiece or for a method according to the invention other layers are also suitable. For example, in particular for the coating of structural parts are also suitable a-C:H:Si, i.e. silicon/carbon layers, a-C:H:Si:Me, i.e. silicon/carbon/metal layers, a-C:H/a-Si:O, i.e. carbon/silicon oxide layers, which can be produced with properties similar to the above cited carbon-containing layers.

Furthermore, in addition to the tungsten listed here, other metals can also be used, such as Ti, Zr, Hf, V, Nb, Ta, Mo or Fe, but preferably Cr for the Me/C, MeC/C and a-C:H:Si:Me layers. Also possible are combinations of several metals.

Other materials, which offer advantages for the formation of at least the outermost layer of the layer system are $MOS_2$, $WS_2$, $MoSe_2$ or $WSe_2$.

The first layer of the layer system is advantageously an adhesion layer comprised of one or several metals of the above listed selection. If the layer system is comprised of at least one hard layer and at least one carbon-containing slide layer, an additional metallic intermediate layer, separating the hard layer and the slide layer, can be of advantage. A combination of several metals, especially the above listed, is also possible.

The application of graduated layer transitions can also be utlizied to optimize the layer properties. For example, it is advantageous to provide carbon-containing layers with a carbon fraction increasing from a metallic adhesion layer in the direction toward the surface.

Depending on the intended application, the total layer thickness of the layer system can be set to between 0.5-20 µm. But, due to the abrasive wear frequently occurring even in lubricated tribo systems through entrained particles, in many cases a minimum layer thickness of one micrometer is to be preferred. Due to the process economics when depositing PVD layers, a maximum layer thickness of approximately 10 µm will be considered at least for products of mass production.

Structured layers according to the invention can be applied especially advantageously on structural parts, which have at least one functional face implemented as a slide face. Examples are friction bearings, slide seals, sealing rings, piston rings, bucket tappets, rocker arms or crankshafts.

Layers structured according to the invention can also advantageously be applied on tools, which have at least one functional face implemented as a slide face. Examples are in particular cutting tools with at least one contact face, for turning, clearing and broaching or milling applications or forming tools with at least one extrusion face, such as for example cold massive forming tools.

As the base materials, steels as well as hard metals are suitable. If the structuring is carried out with a laser, ceramic materials and special metals can also be structured without encountering problems.

In an embodiment example for the production of tools according to the invention, structural parts as well as test bodies, these are first coated with a combined PVD/CVD process, in which a layer system is deposited on the functional face. First, an adhesion layer is applied using a PVD sputter process and subsequently an increasing fraction of carbon-containing gas is added to the working gas. This fraction is increased during the deposition of metal/carbon layers up to a desired maximum value and the coating process is subsequently stopped (reactive PVD process step). If the terminal layer in the layer system is to be a DLC layer, then starting at a specific point in time the sputter process is stopped, a pulsed bias voltage is applied to the substrate and subsequently the DLC layer is deposited. This last process step corresponds to a CVD process, since here physical vaporization no longer takes place. Further specifications regarding the applied methods can be found in the examples listed below.

It is understood by a person skilled in the art that such layers can also be produced with pure PVD or CVD processes, however, the combined methods described in detail in the examples, offer the advantage of a very high process flexibility and, due to the PVD adhesion layer, especially good adhesion.

Structuring after the application of the layer system on at least a portion of the functional face(s) is carried out with laser working systems by several companies (for example Lambda Physik, SurTech, CMT Rickenbach). KrF excimer lasers with a wavelength of λ=248 nm were inter alia used and energy densities up to 6 $J/cm^2$ were utilized. The spots were produced with a diameter between 50-250 µm and a depth of 10-15 µm in cubic as well as hexagonal configuration and a degree of coverage between 10 to 50%.

The test series were largely carried out with circular structures with a maximum diameter between 80 to 100 µm, in cubic or hexagonal configuration and a degree of areal coverage between 15 and 40%. This configuration has yielded especially good results in previously carried out tests.

EMBODIMENT OF THE INVENTION IN EXAMPLES

1) Structuring

Depending on the test, the structuring was carried out before or after the application of the particular layer system. Structure patterns of the following structure geometry were introduced with a pulsed, focusable laser:

TABLE 1

| Structure geometry | |
|---|---|
| Hole Depth | 8-15 µm |
| Hole Diameter | 80-100 µm |
| Degree of Coverage | 30% |
| Hole | Hexagonal Configuration, i.e. |

TABLE 1-continued

| Structure geometry | |
|---|---|
| Configuration | 60° angle between the main axes |
| Hole distance a | 250 μm |

2) Determination of Coefficient of Friction and Wear Tests

To asses the performance capacity of the layers, a ball-and-disk test was performed, in which an uncoated steel ball is guided circularly on a coated structured steel disk. The coefficient of friction as well as the wear diameter was measured on the uncoated ball. Upon reaching a coefficient of friction of 0.4, the test was terminated prematurely. The test parameters are listed in the following table:

TABLE 2

| Test parameters tribo test ball-disk | |
|---|---|
| Deficiency of lubrication | Filter paper was saturated by applying oil dropwise, subsequently pressed onto the sample surface for a specific time such that the oil film was uniformly distributed |
| Mineral oil class | SAE 5W30 |
| Test body - base material | Steel 1.2842 (90MnCrV8), corresponds to SAE (AISI) 52100 |
| Test body surface | polished, Ra ≦ 0.05 |
| Test body bulk | d = 22 mm, h = 5.6 mm |
| Ball | Steel, 100Cr6 |
| Ball diameter | 3 mm |
| Wear travel | approximately 2.2 km |
| Outer temperature | 21° C. |
| Relative air humidity | 39% |
| Load | 30 N |
| Speed at measurement radius | 30 cm/s |
| Measurement radius | 9 mm |

3) DLC Layers

For the application of the structure, the workpieces were pretreated according to a conventional cleaning method before or after the application of the coating, fastened on a substrate holder and the latter was mounted rotating about two axes in a BAl 830-DLC coating installation.

Chamber dimensions (nonagon): $d_i$=846 mm, h=920 mm
Chamber volume: V=560 l
Plasma sources:
two opposing planar magnetron sputter sources AK 618 (h=464 mm, w=146 mm) fastened on the inner chamber periphery to apply the chromium adhesion layer.
pulse generator connected between workpiece mounting and chamber.

The DLC layer was deposited according to a PVD/CVD process known from WO 0179585A1 with a chromium adhesion layer, a gradient layer and a pure DLC or a:C-H layer, the total layer thickness being approximately 2 μm. The parameters utilized for depositing the a:C-H layer are specified in the table below.

TABLE 3

| Production parameters a:C—H layer | |
|---|---|
| Process pressure | $6.0 \times 10^{-3}$ mbar |
| Gas flow $C_2H_2$ | 280 sccm |

TABLE 3-continued

| Production parameters a:C—H layer | |
|---|---|
| Gas flow Ar | 30 sccm |
| Pulse frequency (f) | 50 kHz |
| Pulse width negative pulse (pulse-duty factor - 95%) | 19 μs |
| Pulse width positive pulse (pulse-duty factor - 5%) | 1 μs |
| Pulse pause (0%) | 0 μs |
| Bias coil voltage | −900 V |
| Coil current top | 8 A |
| Coil current bottom | 2 A |
| Coating time | 90 min |

The deposited DLC layer was measured and was found to have a layer hardness of 2500 $HK_{0.05}$. No increase of roughness was observed compared to uncoated polished samples. Coefficient of friction and results of the wear tests of the DLC layer can be found in Table 4 below. It was found that the coefficient of friction as well as also the wear of the counterbody in the case of first deposited and subsequently structured surfaces according to the invention (column 5) were improved, i.e. changed to lower values than coated unstructured (column 3) or first structured and subsequently coated surfaces (column 4).

TABLE 4

| Coefficients of friction and wear test of the DLC layer | | | | |
|---|---|---|---|---|
| Results DLC | uncoated | coated | structured and coated | coated and structured |
| Coeff. of friction dry | 0.6 | 0.16 | 0.15 | 0.13 |
| Coeff. of friction deficiency of lubrication | 0.1 | 0.08 | 0.06 | 0.058 |
| wear diameter [μm] | seizing | 586 | 380 | 243 |

Similarly good results were obtained with DLC layers, on whose surface an additional slide layer with a lesser hardness was deposited. Examples of the production of such layers can also be found in the above cited application.

4) MeC:C-H Layers

For the application of the coating the workpieces were cleaned, fastened on a substrate holder and mounted rotating about two axes in a BAl 830C coating installation.

This coating installation has substantially the same geometry as that described under 3), but differs thereby that, in addition to the two planar magnetron sputter sources equipped with Cr targets, six more sources equipped with pure WC or Co-bound WC targets of the same type, are fastened on the inner chamber periphery. Furthermore, at this installation a DC bias but no pulse bias supply is provided.

After completing a known plasma heating and a plasma etching process, in which the workpiece carrier is first connected to the positive and subsequently to the negative pole of a DC voltage source, while simultaneously a low-voltage arc is operated in the installation axis, a chromium adhesion layer is sputtered on while a negative substrate bias (−75 V) is applied. Subsequently a MeC:C-H layer is applied with a carbon content increasing toward the surface. The parameters utilized for the deposition of the terminal MeC:C-H layer are specified in the table below. Such a layer is also known under the tradename Balinit Kohlenstoff.

TABLE 5

Production parameters MeC:C—H layer

| | |
|---|---|
| Process pressure | 2-5 × 10$^{-3}$ mbar |
| Total time WC sputtering | 90 min |
| Power/Target (×6) | 3 kW |
| Start C$_2$H$_2$ flow after | 9 min |
| C$_2$H$_2$ ramp 1 (0-200 sccm) | 16 min |
| Time with f C$_2$H$_2$ = 200 sccm | 39 min |
| C$_2$H$_2$ ramp 2 (200-225 sccm) | 16 min |
| Time with f C$_2$H$_2$ = 225 sccm | 10 min |
| Gas flow Ar | 115 sccm |

On the deposited WC:C-H layer a layer thickness of 2.0 µm and a layer hardness of 1000 HK$_{0.05}$ was measured. An increase of the roughness by approximately 0.01-0.02 Ra was found compared to uncoated polished samples.

Coefficient of friction and results of the wear tests of the MeC:C-H layer can be found in the following Table 6. In this case the layer subsequently structured according to the invention was also found to be superior to the conventionally structured layer.

TABLE 6

Coefficients of friction and wear test of the MeC:C—H layer

| Results MeC:C—H | coated | structured and coated | coated and structured |
|---|---|---|---|
| Coeff. of friction dry | 0.13 | 0.12 | 0.12 |
| Coeff. of friction deficiency of lubrication | 0.08 | 0.06 | 0.05 |
| Wear diameter [µm] | 487 | 290 | 182 |

5) TiAlN Layers

For the application of a comparative coating with a hard layer system, the workpieces were cleaned, fastened on a substrate holder and mounted rotating about two axes in a BAl 1200 Arc coating installation.

| | |
|---|---|
| Chamber dimensions: | d$_1$ = 1,200 mm, h = 1,272 mm |
| Chamber volume: | V = 1650 l |
| Plasma sources: | eight arc sources, fastened in two different planes on the inner chamber periphery, with a target diameter of 154 mm. Of these, four each (two above, two below) were equipped with Ti or Ti$_{0.5}$Al$_{0.5}$ targets. laterally disposed low-voltage arc devices for pretreatment steps as well as heat radiator to bring the workpieces to temperatures up to 500° C. |

The applied layer system is comprised of a TiN adhesion layer, a multilayer with a layer sequence of alternating TiAlN layers with different Ti/Al ratio as well as a TiAlN cover layer. Details can be found in the following Table 7).

TABLE 7

Production parameters TiAlN layer

| Parameter | TiN adhesion layer | (Ti$_{0.9}$Al$_{0.1}$)N layer | (Ti$_{0.6}$Al$_{0.4}$)N layer | (Ti$_{0.6}$Al$_{0.4}$)N cover layer |
|---|---|---|---|---|
| t$_{coat}$ [min] | 10 | 4 × 6 | 12 × 5 | 46 |
| Layer number | 1 | 6 | 5 | 1 |

TABLE 7-continued

Production parameters TiAlN layer

| Parameter | TiN adhesion layer | (Ti$_{0.9}$Al$_{0.1}$)N layer | (Ti$_{0.6}$Al$_{0.4}$)N layer | (Ti$_{0.6}$Al$_{0.4}$)N cover layer |
|---|---|---|---|---|
| P$_{N2}$ [mbar] | 8 · 10$^{-3}$ | 3.2 · 10$^{-2}$ | 3.2 · 10$^{-2}$ | 3.2 · 10$^{-2}$ |
| I$_{Ti}$ [A] | 170 | 200 | 0 | 0 |
| I$_{TiAl}$ [A] | 0 | 200 | 200 | 200 |
| U$_{substrate}$ [V] | −200 | −40 | −40 | −40 |

The deposited TiAlN layer was measured to have a layer thickness of 2.5 µm and a layer hardness of 3000 HK$_{0.05}$. The increase of roughness was between 0.06-0.20 Ra compared to uncoated polished samples.

TABLE 8

Coefficients of friction and wear tests of the TiAlN layer

| Results TiAlN | coated | structured and coated | coated and structured |
|---|---|---|---|
| Coeff. of friction dry | 0.4 | 0.35 | 0.33 |
| Coeff. of friction deficiency of lubrication | 0.1 | 0.09 | 0.08 |
| Wear diameter [µm] | 721 | 632 | 543 |

Even when using as the layer system a pure hard material coating as described above, compared to known, first structured and subsequently coated workpiece, an improvement could also be attained through subsequent structuring of the layer according to the invention.

6) TiAlN/MeC:C-H Layers

For the production of TiAlN/MeC:C-H layers a WC:C-H layer deposited according to 4) was applied onto a TiAlN layer produced according to 5).

A layer thickness of approximately 4.5 µm and a layer hardness of 1500 HK$_{0.05}$ was measured on the deposited TiAlN/MeC:C-H layers. The increase of roughness was between 0.06-0.20 Ra compared to uncoated polished samples.

In comparison to the results of the MeC:C-H layer in Table 6, the results in Table 9 show somewhat greater wear and higher coefficients of friction, which is probably due to the greater layer roughness.

TABLE 9

Coefficients of friction and wear test of the TiAlN/MeC:C—H layer

| Results TiAlN/MeC:C—H | coated | structured and coated | coated and structured |
|---|---|---|---|
| Coeff. of friction dry | 0.15 | 0.14 | 0.14 |
| Coeff. of friction deficiency of lubrication | 0.08 | 0.06 | 0.055 |
| Wear diameter [µm] | 512 | 329 | 255 |

All of the layers 3) to 6) exhibited excellent adhesion on the substrate (HF1 measured according to VDl3198).

It is furthermore evident that in the case of carbon-containing layer systems according to the invention, even with a structuring known per se, such as for example before the deposition of the layer, in comparison to pure hard material layers such as TiAlN in Example 5), markedly better wear properties and a lower coefficient of friction are attained.

DRAWING

Figure 2:
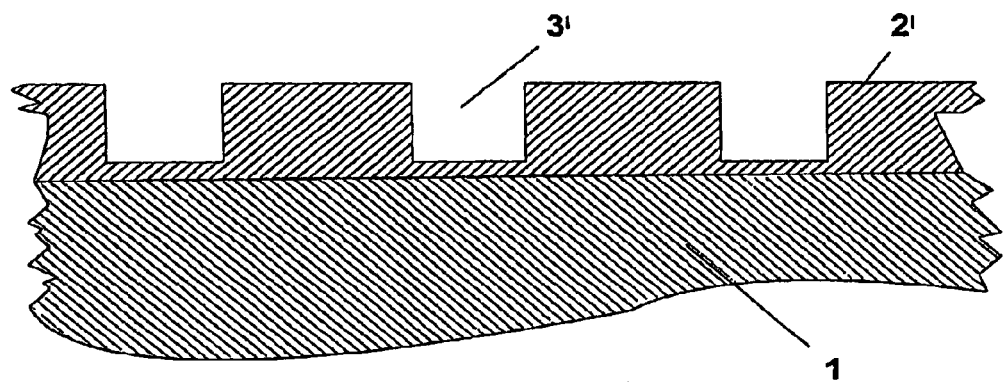
Figure 3:
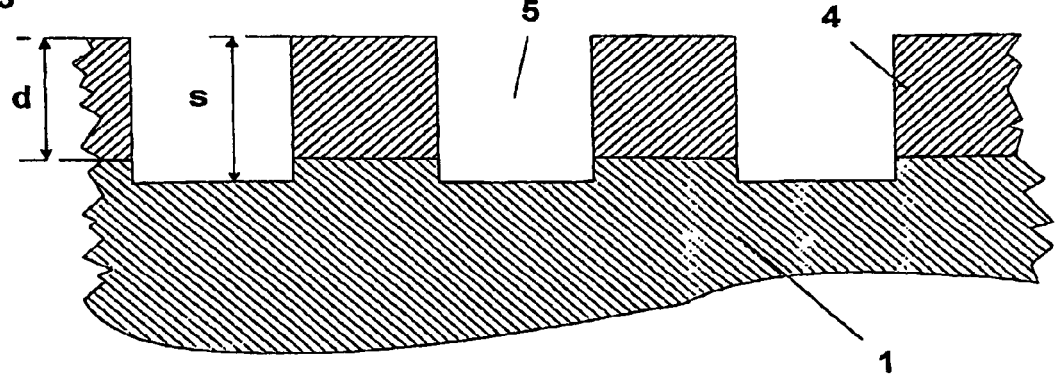
Figure 4:
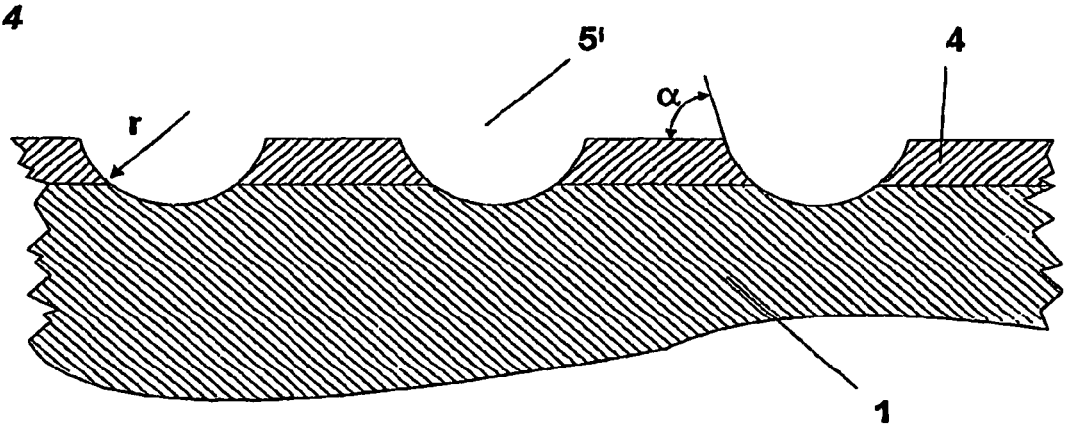
Figure 5:
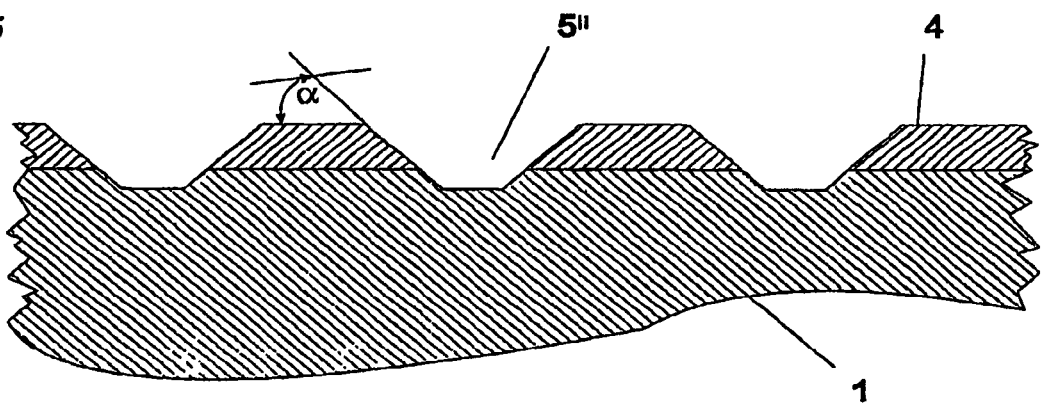
Figure 5:
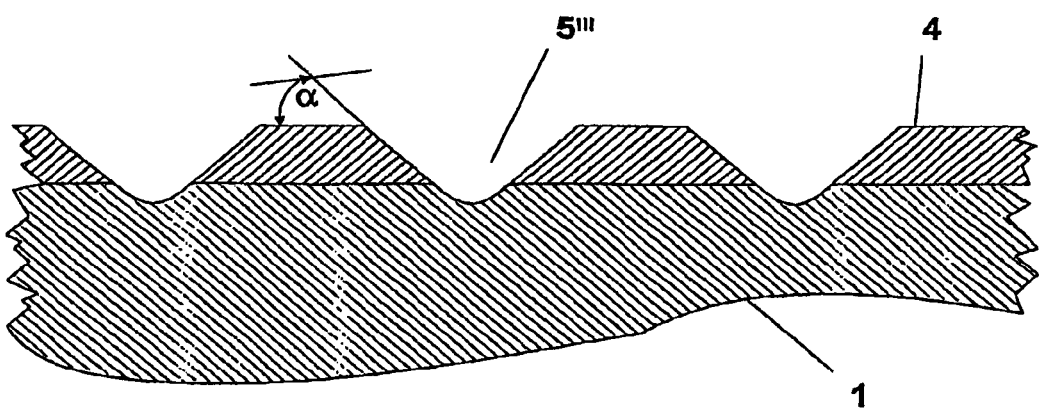
Figure 6:
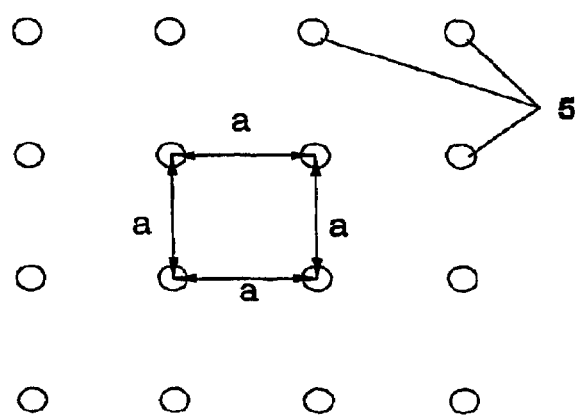
Figure 7:
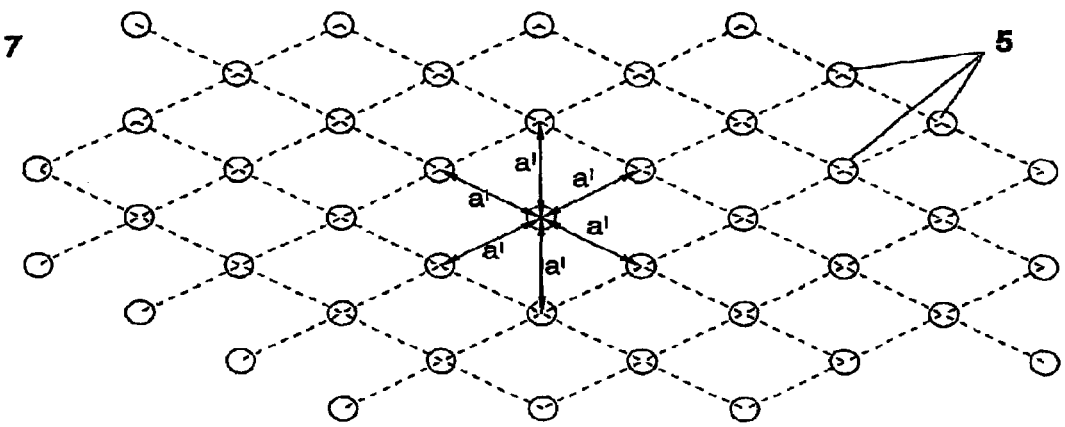

Prior art as well as several preferred embodiments of the invention will be explained by example in the following drawing. Therein depict:

FIG. 1 section through a known microstructure,

FIG. 2 section through another known microstructure,

FIG. 3 section through a microstructure according to the invention,

FIG. 4 section through a circular microstructure,

FIG. 5 section through a conical microstructure,

FIG. 6 plan view onto a cubic structure pattern with circular microstructures, and FIG. 7 plan view onto a hexagonal structure pattern with circular microstructures.

The section depicted in FIG. 1 shows a known surface structure 3 on a workpiece 1 coated with a functional layer 2. First, on the uncoated body a structure was generated and subsequently the layer was applied.

The section depicted in FIG. 2 shows another known surface structure 3', which was subsequently applied in the functional layer. The structure depth is therein less than the layer thickness.

The section shown in FIG. 3 shows a microstructure 5 according to the invention with a layer system 4 on a workpiece 1. The structure depth s is therein selected to have, as described above, a specific ratio to the layer thickness d.

FIG. 4 shows microstructures 5' with circular, FIG. 5 shows microstructures 5" with conical cross section, a tangential angle a being formed between a decreasing structure slope and the surface horizontal.

FIGS. 6 and 7 serve to explain the preferred cubic or hexagonal configurations of surface structures according to the invention with hole distance (center to center) of a or a'.

What is claimed:

1. Workpiece with at least one functional face and a layer system deposited by means of a CVD or PVD process on at least a portion of the functional face as well as a structure pattern, which encompasses at least a portion of the layer system and which is comprised of at least one three-dimensional microstructure with structure depth S, wherein the three-dimensional microstructure extends from the surface of the layer system up into the workpiece, such that it is uncoated in a lower region of the microstructure, wherein at least the outermost layer of the layer system comprises at least one carbon-containing slide layer, the ratio of the layer thickness d of the layer system to the structure depth S being between 0.05 and 0.9, and the carbon-containing slide layer being at least one of an Me/C, MeC/C, a-C:H:Si:Me, SiC/C, a-C:H:Si, a-C:H/a-Si:O, or DLC slide layer, where Me is selected from the group consisting of: Ti, Zr, Hf, V, Nb, Ta, Cr, Mo, W or Fe.

2. Workpiece as claimed in claim 1, wherein the carbon-containing slide layer comprises a metallic adhesion layer and the carbon-containing slide layer has a carbon content that increases from the metallic adhesion layer to the surface of the layer system.

3. Workpiece as claimed in claim 1, wherein the layer system comprises at least one hard layer.

4. Workpiece as claimed in claim 1, wherein the layer thickness of the layer system is between 0.5-20 μm.

5. Workpiece as claimed in claim 4, wherein the layer thickness of the layer system is between 1-10 μm.

6. Workpiece as claimed in claim 1, wherein the structure pattern in plan view is comprised of a multiplicity of substantially spot-form cavities, which, in turn, are disposed circularly, elliptically, in the form of lines, in the form of polygons or as hexagonal or cubic spot pattern.

7. Workpiece as claimed in claim 6, wherein the cavities, in turn, in plan view have a circular, elliptical or polygonal shaping.

8. Workpiece as claimed in claim 1, wherein the structure pattern is formed of circular, elliptical, polygonal, straight or wave-form lines.

9. Workpiece as claimed in claim 1, wherein on the portion of the layer system, encompassed by the structure pattern, the degree of areal coverage is between 10-50% of the microstructured surface.

10. Workpiece as claimed in claim 9, wherein on the portion of the layer system, encompassed by the structure pattern, the degree of areal coverage is between 15-35%, of the microstructured surface.

11. Workpiece as claimed in claim 1, wherein the cross section of the cavities (5) is substantially circular (5').

12. Workpiece as claimed in claim 1, wherein a tangential angle α between the surface horizontal and a decreasing structure slope is less than 15°.

13. Workpiece as claimed in claim 1, wherein the structure pattern of the layer system comprises circular structures (5) with a diameter measured on the surface of 5 to 350 μm and has a degree of areal coverage of 10 to 50%.

14. Workpiece as claimed in claim 1, wherein the workpiece is a sliding structural part with at least one functional face implemented as a slide face.

15. Workpiece as claimed in claim 1, wherein the workpiece is a working tool with at least one functional face implemented as a slide face.

16. Workpiece as claimed in claim 1, wherein the ratio of the layer thickness d of the layer system (4) to the structure depth S is between 0.1 and 0.6.

17. Workpiece as claimed in claim 1, wherein the at least one carbon-containing slide layer is selected from the group consisting of a layer of: SiC/C, a-C:H:Si, a-C:H:Si:Me, an a-C:H/a-Si:O, DLC, Me/C, MeC/C, and WC/C; the ratio of the layer thickness d of the layer system (4) to the structure depth S is between 0.1 and 0.6.

18. Workpiece as claimed in claim 1, wherein the carbon-containing slide layer comprises at least one of the metals W or Cr.

19. Workpiece as claimed in claim 1, wherein the cross section of the cavities is substantially conical (5", 5'").

20. Workpiece as claimed in claim 1, wherein a tangential angle α between the surface horizontal and a decreasing structure slope is less than 10°.

21. Workpiece as claimed in claim 1, wherein the structure pattern of the layer system comprises circular structures (5) with a diameter measured on the surface of 80 to 250 μm, and has a degree of areal coverage of 15 to 40%.

22. Workpiece as claimed in claim 1, wherein the workpiece is a structural part with at least one functional face implemented as a slide face of at least one of a: friction bearing, slide seal, piston ring, bucket tappet, rocker arm, and crankshaft.

23. Workpiece as claimed in claim 1, wherein the workpiece is a tool with at least one functional face implemented as a contact face of a cutting tool.

24. Workpiece as claimed in claim 1, wherein the workpiece is a tool with at least one functional face implemented as an extrusion face of a forming tool.

25. Method for the production of a workpiece with at least one functional face, at least on a portion of the functional face first a layer system is deposited by means of a CVD or PVD process and subsequently microstructured in one or several structuring steps, characterized in that the structuring steps are selected such that the layer system as well as also the workpiece surface are microstructured, at least the outermost layer of the layer system comprising at least one carbon-containing slide layer, the ratio of the layer thickness d of the layer system to the structure depth S being between 0.05 and 0.9, and the carbon-containing slide layer being at least one of an Me/C, MeC/C, a-C:H:Si:Me SiC/C, a-C:H:Si, a-C:H/a-Si:O, or DLC slide layer, where Me is selected from the group consisting of Ti, Zr, Hf, V, Nb, Ta, Cr, Mo, W or Fe.

26. Method as claimed in claim 25, wherein the at least one structuring step is selected such that a degree of areal coverage of 10 to 50% is set.

27. Method as claimed in claim 25, wherein the at least one structuring step comprises a micromechanical step.

28. Method as claimed in claim 25, wherein the at least one structuring step comprises plasma etching, chemical etching or electrochemical etching.

29. Method as claimed in claim 25, wherein the at least one structuring step comprises the application of an etch-resistant lacquer layer with a two-dimensional structure pattern on the surface of the layer system or of the workpiece.

30. Method as claimed in claim 25, wherein the deposition of the layer system takes place by means of a combined PVD/CVD process.

31. Method as claimed in claim 25, wherein the layer thickness of the layer system is set between 0.5-20 μm.

32. Method as claimed in claim 25, wherein the at least one structuring step is selected such that the ratio of layer thickness d of the layer system (4) to the structure depth S is between 0.1 and 0.6.

33. Method as claimed in claim 25, wherein the at least one structuring step is selected such that a degree of areal coverage of between 15 to 40% is set.

34. Method as claimed in claim 25, wherein the at least one structuring step comprises a micromechanical step including working with a laser beam.

35. Method as claimed in claim 31, wherein the layer thickness of the layer system is set between 1-10 μm.

* * * * *